(12) United States Patent
Lu et al.

(10) Patent No.: US 12,550,649 B2
(45) Date of Patent: Feb. 10, 2026

(54) WET ETCHING PROCESS FOR MANUFACTURING SEMICONDUCTOR STRUCTURE

(71) Applicant: TAIWAN SEMICONDUCTOR MANUFACTURING COMPANY, LTD., Hsinchu (TW)

(72) Inventors: Yu-Wei Lu, Hsinchu (TW); Kenichi Sano, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 447 days.

(21) Appl. No.: 18/323,508

(22) Filed: May 25, 2023

(65) Prior Publication Data

US 2024/0395903 A1    Nov. 28, 2024

(51) Int. Cl.
| | |
|---|---|
| *H01L 21/306* | (2006.01) |
| *H10D 30/01* | (2025.01) |
| *H10D 30/63* | (2025.01) |
| *H10D 30/67* | (2025.01) |
| *H10D 62/10* | (2025.01) |
| *H10D 62/40* | (2025.01) |
| *H10D 64/01* | (2025.01) |
| *H01L 23/544* | (2006.01) |

(52) U.S. Cl.
CPC .. *H01L 21/30604* (2013.01); *H01L 21/30608* (2013.01); *H10D 30/019* (2025.01); *H10D 30/0195* (2025.01); *H10D 30/025* (2025.01); *H10D 30/026* (2025.01); *H10D 30/63* (2025.01); *H10D 30/6735* (2025.01); *H10D 62/121* (2025.01); *H10D 62/40* (2025.01); *H10D 62/405* (2025.01); *H10D 64/017* (2025.01); *H10D 64/018* (2025.01); *H01L 23/544* (2013.01); *H01L 2223/54493* (2013.01)

(58) Field of Classification Search
None
See application file for complete search history.

(56) References Cited

U.S. PATENT DOCUMENTS

2020/0044087 A1*  2/2020  Guha ................. H10D 30/6217
2020/0052107 A1*  2/2020  Lie ..................... H10D 30/6744

OTHER PUBLICATIONS

Y. Oniki et al., "Selective Etches for Gate-All-Around (GAA) Device Integration: Opportunities and Challenges", ECS Transactions, vol. 92, pp. 3-12. (Year: 2019).*

* cited by examiner

*Primary Examiner* — Jiong-Ping Lu
(74) *Attorney, Agent, or Firm* — Birch, Stewart, Kolasch & Birch, LLP

(57) ABSTRACT

A method for manufacturing a semiconductor structure includes forming a plurality of semiconductor stack portions spaced apart from each other by a plurality of recesses, each of which includes two sacrificial layer portions and a channel layer portion disposed therebetween, in which the channel layer portion has a plurality of crystal planes and is formed with a first straight lateral surface which is aligned with one of the crystal planes that has a lowest etching rate for an etchant to be used for laterally etching the channel layer portion among those of the crystal planes of the channel layer portion which are able to expose to the recesses; and laterally etching the channel layer portion using the etchant to permit the channel layer portion to be formed with a second straight lateral surface.

20 Claims, 15 Drawing Sheets

WET ETCHING PROCESS FOR MANUFACTURING SEMICONDUCTOR STRUCTURE

BACKGROUND

Transistors are key active components in modern integrated circuits (IC). With rapid development of semiconductor technology, critical dimension (CD) of transistors keeps shrinking and various three-dimensional (3D) transistor structures are springing up, making it possible to integrate a large number of transistors per unit area. Meanwhile, for each type of structural design of the transistors, some process steps in a corresponding one of methods for forming the transistors will become more critical, and thus, methods for manufacturing advanced node transistors are in continuous development.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
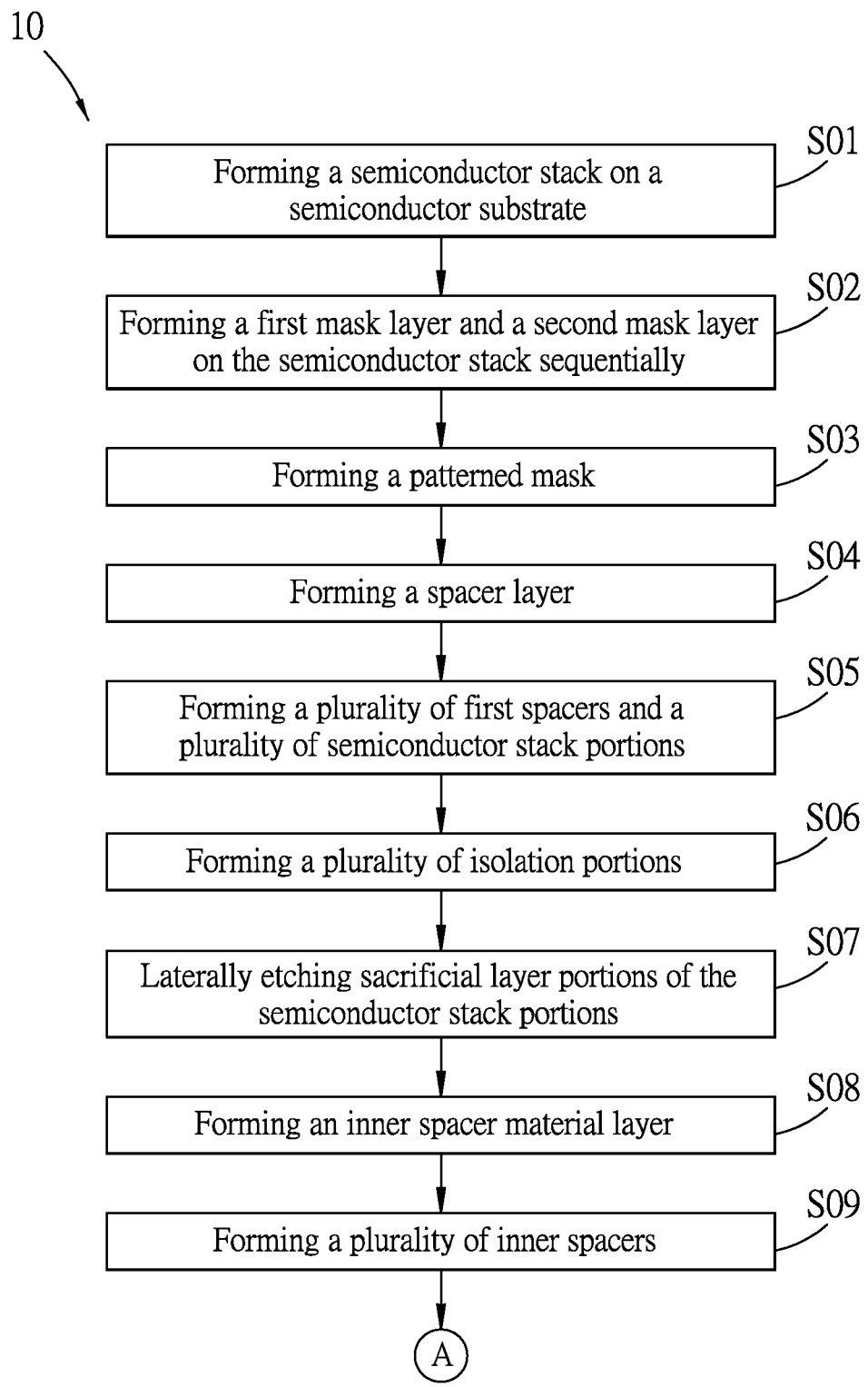
FIGS. 1A and 1B are flow diagrams illustrating a method for manufacturing a semiconductor structure in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "downwardly," "upwardly," "top," "upper," "lower," "over," "below," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

For the purposes of this specification and appended claims, unless otherwise indicated, all numbers expressing amounts, sizes, dimensions, proportions, shapes, formulations, parameters, percentages, quantities, characteristics, and other numerical values used in the specification and claims, are to be understood as being modified in all instances by the term "about" even though the term "about" may not expressly appear with the value, amount or range. Accordingly, unless indicated to the contrary, the numerical parameters set forth in the following specification and attached claims are not and need not be exact, but may be approximate and/or larger or smaller as desired, reflecting tolerances, conversion factors, rounding off, measurement error and the like, and other factors known to those of skill in the art depending on the desired properties sought to be obtained by the presently disclosed subject matter. For example, the term "about," when referring to a value can be meant to encompass variations of, in some aspects ±10%, in some aspects ±5%, in some aspects ±2.5%, in some aspects ±1%, in some aspects ±0.5%, and in some aspects ±0.1% from the specified amount, as such variations are appropriate to perform the disclosed methods or employ the disclosed compositions.

With the rapid development of semiconductor technology, the structural design of semiconductor devices has evolved from bulk silicon-based devices, silicon on insulator-based (SOI-based) devices, Fin-type transistors (FinFETs), gate-all-around transistors (GAAFETs), nanosheet GAAFETs, nanowire GAAFETs, forksheet-based devices, to complementary transistors (CFET, a stack of FETs). In addition to size miniaturization so as to achieve a high integration density, the direction of a current flow from a source to a drain will evolve from horizontal (i.e., lateral FET, LFET) to vertical (i.e., vertical FET (VFET) or vertical GAA (VGAA)) in the next technology node. As such, nanowire-shaped channels or nanosheet-shaped channels may be elongated vertically and arranged in an array, and can be arranged more regularly and closely with one another. However, when semiconductor portions (for example, but not limited to, silicon (Si) nanosheet portions) in fin structures are treated by a wet etching back process using an etchant (for example, but not limited to, an alkaline etchant) so as to form vertical channels of the VFET or the VGAA, each of the semiconductor portions after the wet etching back process (or each of the vertical channels formed thereby) may be formed with a necking part due to a faceting issue, and the semiconductor portions (or the vertical channels formed thereby) may collapse in the subsequent processing stages. The faceting issue arises from a certain crystal plane of the semiconductor portions in the fin structures which has a very low etching rate, and such crystal plane is normally a "stop" plane for the wet etching back process. Therefore, the present disclosure is directed to a wet etching process using an alkaline etchant for recessing the semiconductor portions in the fin structures in a method for manufacturing a semiconductor structure, such that each of the semiconductor portions after the wet etching process (or each of the vertical channels formed thereby) is formed a straight lateral surface (i.e., without formation of the necking part). The semiconductor structure may be applied to devices with different structures (e.g., the devices described above), other three-dimensional transistors, or other suitable devices.

Figure 1B:
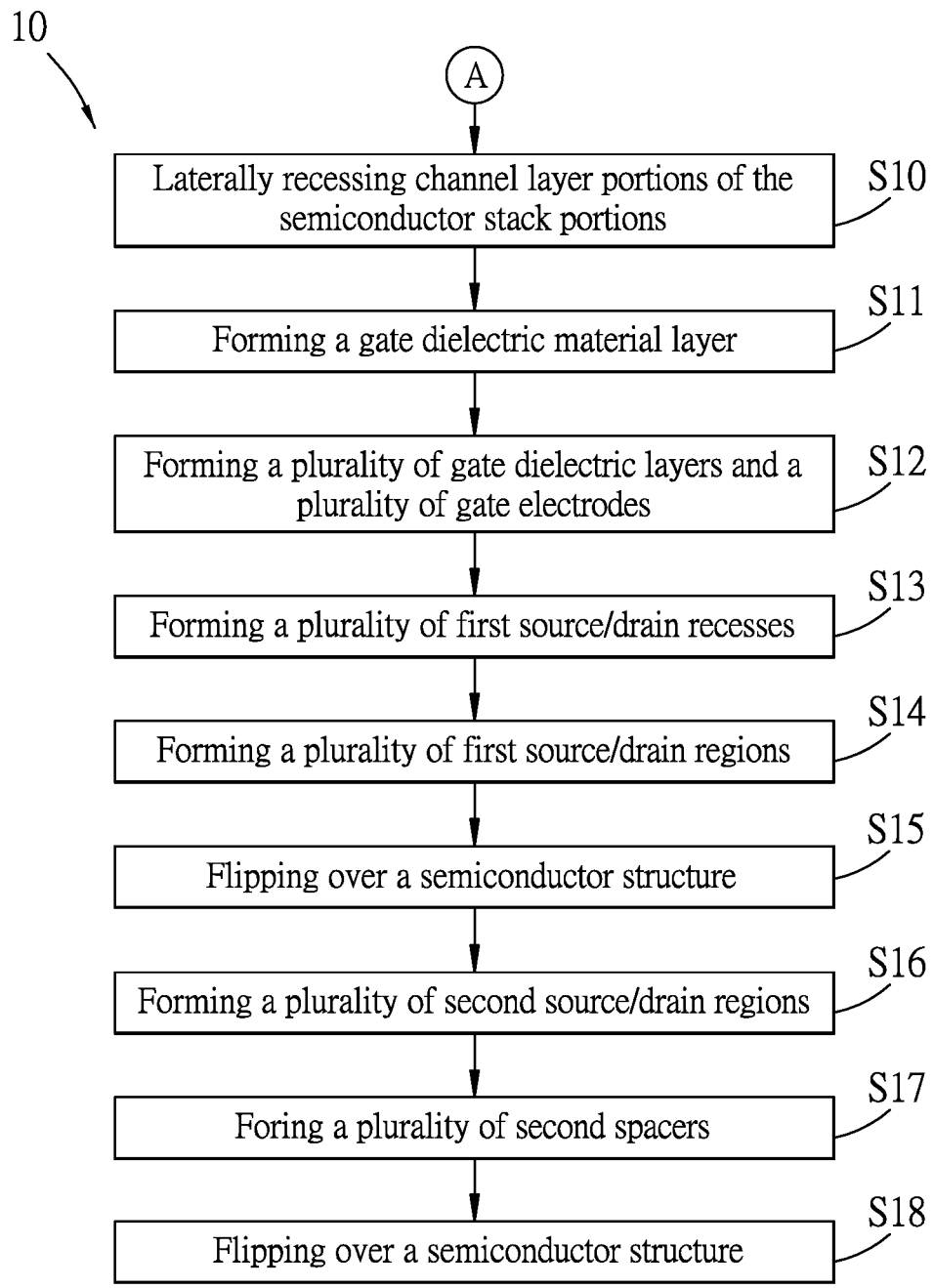
Figure 18:
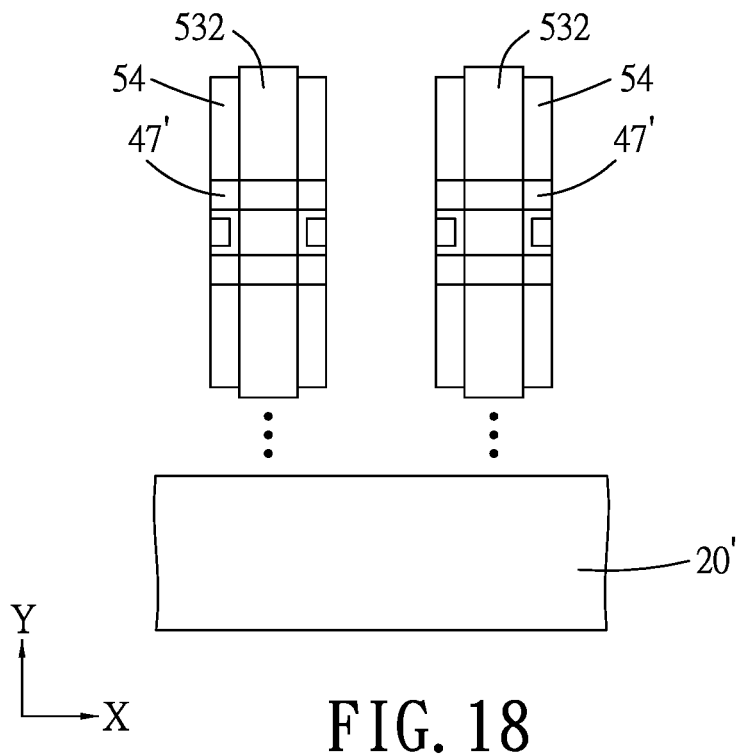
Figure 19:
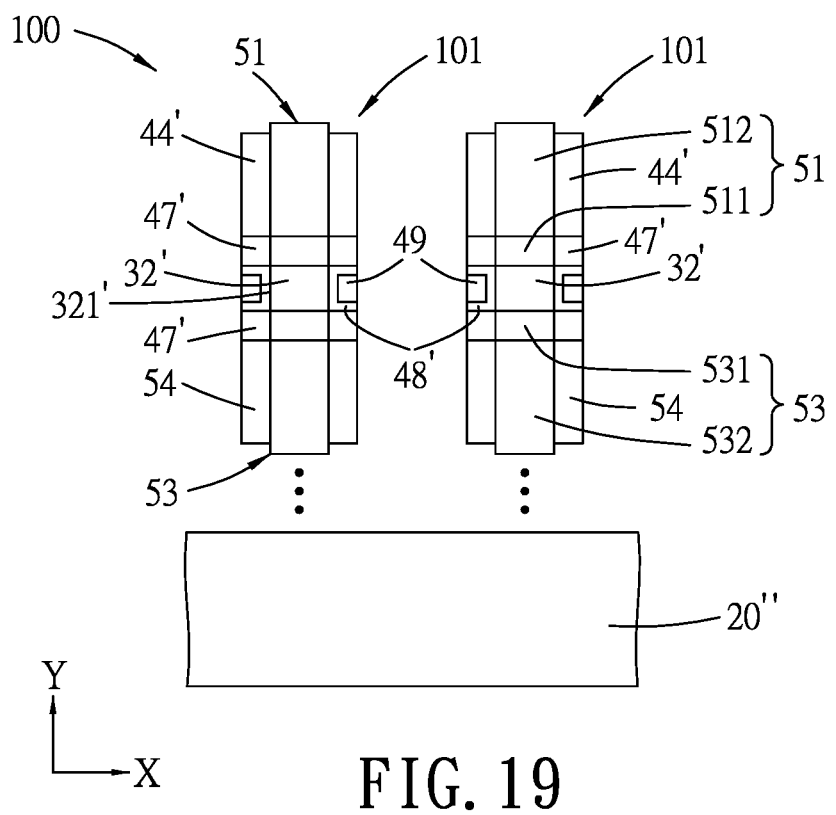

FIGS. 1A and 1B are flow diagrams illustrating a method 10 for manufacturing a semiconductor structure (for example, the semiconductor structure 100 including a plurality of device units 101 shown in FIG. 19) in accordance with some embodiments. FIGS. 2 to 23 illustrate schematic views of some intermediate stages of the method 10 in accordance with some embodiments. Some repeating structures and some components are omitted in FIGS. 2 to 23 for the sake of brevity.

Figure 2:
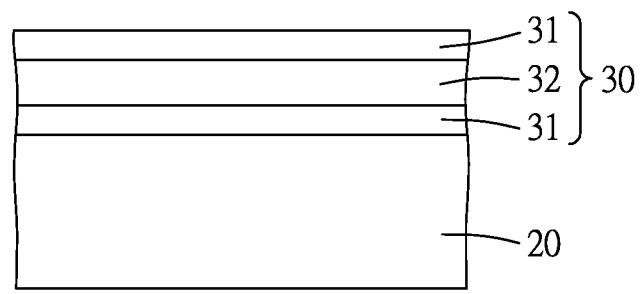
FIGS. 2 to 23 illustrate schematic views of some intermediate stages of the method depicted in FIGS. 1A and 1B in accordance with some embodiments.

Referring to FIG. 1A and the example illustrated in FIG. 2, the method 10 begins at step S01, where a semiconductor stack 30 is formed on a semiconductor substrate 20. In some embodiments, the semiconductor stack 30 includes two sacrificial layers 31 and one channel layer 32 disposed between the sacrificial layers 31.

In some embodiments, the semiconductor substrate 20 may be made of an elemental semiconductor material, such as crystalline silicon (Si), diamond, or germanium (Ge); a compound semiconductor material, such as silicon carbide (SiC), gallium arsenide (GaAs), indium arsenide (InAs), or indium phosphide (InP); or an alloy semiconductor material, such as silicon germanium (SiGe), silicon germanium carbide (SiGeC), gallium arsenic phosphide (GaAsP), or gallium indium phosphide (GaInP). In addition, the semiconductor substrate 20 may be a bulk silicon substrate, a silicon-on-insulator (SOI) substrate, or a germanium-on-insulator (GOI) substrate. Other suitable materials for the semiconductor substrate 20 are within the contemplated scope of the present disclosure.

In some embodiments, the sacrificial layers 31 may include silicon germanium (SiGe). Other suitable materials for the sacrificial layers 31 are within the contemplated scope of the present disclosure. In some embodiments, the channel layer 32 may include silicon (Si). Other suitable materials for the channel layer 32 are within the contemplated scope of the present disclosure. In some embodiments, the sacrificial layers and the channel layers may be formed by a suitable epitaxial process, for example, but not limited to, molecular beam epitaxy (MBE) or other suitable epitaxial processes. Since the sacrificial layers 31 and the channel layer 32 are formed on semiconductor substrate 20 by the epitaxial process, they may have crystal planes which are the same as those of the semiconductor substrate 20. In some embodiments, the semiconductor substrate 20 is a silicon (100) wafer, which has a (100) crystal plane, a (110) crystal plane, and a (111) crystal plane, and the channel layer 32 formed on the semiconductor substrate 20 by the epitaxial process also has the (100), (110), and (111) crystal planes of the silicon (100) wafer. In some other embodiments, the semiconductor substrate 20 is a silicon (110) wafer, which has the (100), (110), and (111) crystal planes that are oriented in directions different from those of the (100), (110), and (111) crystal planes of the silicon (100) wafer, and the channel layer 32 formed on the semiconductor substrate 20 by the epitaxial process also has the (100), (110), (111) crystal planes of the silicon (110) wafer.

Figure 3:
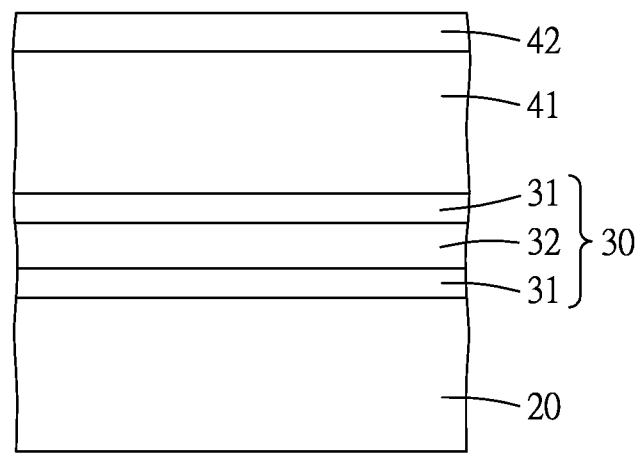

Referring to FIG. 1A and the example illustrated in FIG. 3, the method 10 proceeds to step S02, where a first mask layer 41 and a second mask layer 42 are formed on the semiconductor stack 30 sequentially. In some embodiments, each of the first mask layer 41 and the second mask layer 42 may independently include silicon nitride, silicon oxide, silicon carbide, silicon oxycarbide, silicon oxynitride, silicon carbon nitride, silicon oxycarbonitride, or combinations thereof. In some embodiments, the first mask layer 41 includes a composition different from that of the second mask layer 42. In some embodiments, each of the first mask layer 41 and the second mask layer 42 may be formed by a suitable deposition process, for example, but not limited to, chemical vapor deposition (CVD) (e.g., plasma-enhanced CVD (PECVD)), atomic layer deposition (ALD) (e.g., plasma-enhanced ALD (PEALD)), or other suitable deposition processes.

Figure 4:
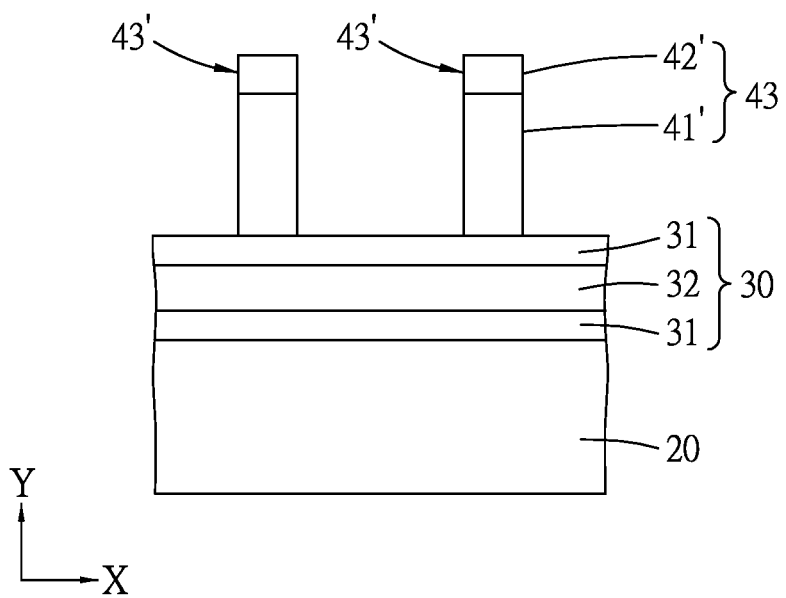

Referring to FIG. 1A and the example illustrated in FIG. 4, the method 10 proceeds to step S03, where a patterned mask 43 is formed. The patterned mask 43 includes a first patterned mask layer 41' disposed on the semiconductor stack 30 and a second patterned mask layer 42' disposed on the first patterned mask layer 41'. The first patterned mask layer 41' and the second patterned mask layer 42' are formed from the first mask layer 41 and the second mask layer 42, respectively. In some embodiments, the patterned mask 43 may be formed by the following sub-steps of: (i) forming a photoresist layer (not shown) on the second mask layer 42 of the structure shown in FIG. 3, (ii) performing a lithography process to pattern the photoresist layer, (iii) etching the second mask layer 42 and the first mask layer 41 of the structure shown in FIG. 3 sequentially through the patterned photoresist layer to obtain the patterned mask 43, and (iv) removing the patterned photoresist layer by an ashing process. The patterned mask 43 thus obtained includes a plurality of mask portions 43' spaced apart from each other in a first direction (X) parallel to a surface of the semiconductor substrate 20 and extending upwardly from the semiconductor stack 30 in a second direction (Y) transverse to the first direction (X). In some embodiments, the first direction (X) and the second direction (Y) are perpendicular to each other.

Figure 5:
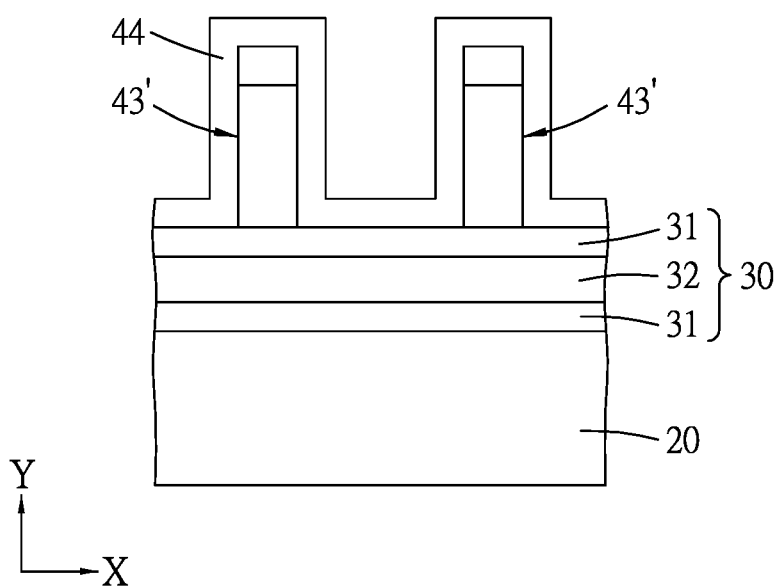

Referring to FIG. 1A and the example illustrated in FIG. 5, the method 10 proceeds to step S04, where a spacer layer 44 is formed. In some embodiments, the spacer layer 44 may be formed by conformally depositing a dielectric material over the structure shown in FIG. 4 using, for example, CVD, ALD, or other suitable deposition techniques, to cover the patterned mask 43 and the semiconductor stack 30. In some embodiments, the dielectric material for forming the spacer layer 44 may include silicon nitride, silicon oxide, silicon carbide, silicon oxycarbide, silicon oxynitride, silicon carbon nitride, silicon oxycarbonitride, or combinations thereof. The dielectric material for forming the spacer layer 44 includes a composition different from those of the first mask layer 41 and the second mask layer 42.

Figure 6:
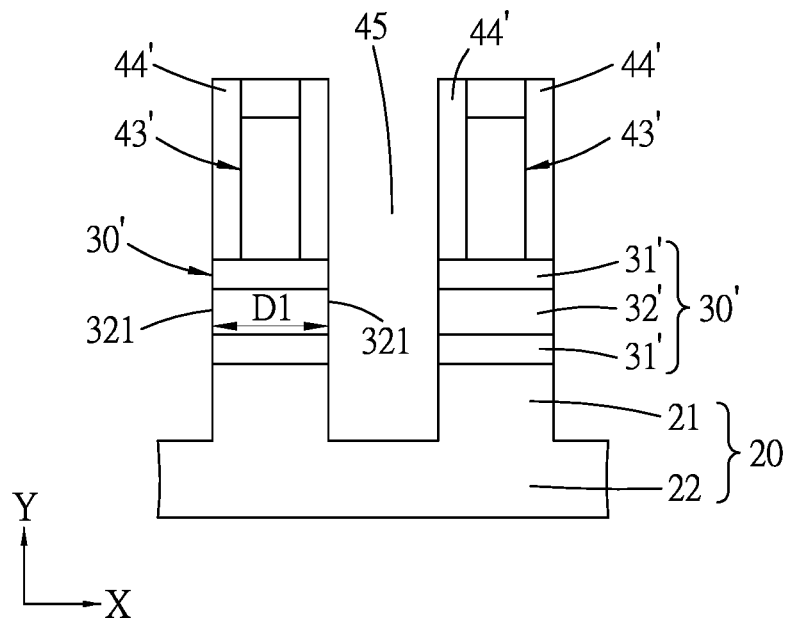

Referring to FIG. 1A and the example illustrated in FIG. 6, the method 10 proceeds to step S05, where a plurality of first spacers 44' and a plurality of semiconductor stack portions 30' are formed. Each of the first spacers 44' covers a corresponding one of two opposite lateral surfaces of a corresponding one of the mask portions 43'. The semiconductor stack portions 30' are disposed below the mask portions 43', respectively, and are spaced apart from each other in the first direction (X). Each of the semiconductor stack portions 30' includes two sacrificial layer portions 31' and one channel layer portion 32' disposed between the sacrificial layer portions 31'. Each of the sacrificial layer portions 31' is formed from a corresponding one of the sacrificial layers 31 and the channel layer portion 32' is formed from the channel layer 32. In some embodiments, the first spacers 44' may be formed using an anisotropic dry etching process to remove horizontal portions of the spacer layer 44, which are respectively formed on upper surfaces of the mask portions 43' and portions of an upper surface of the semiconductor stack 30 (see FIG. 5), such that the remaining portions of the spacer layer 44 serve as the first spacers 44'. Each pair of the first spacers 44' are formed to cover the two opposite lateral surfaces of a corresponding one of the mask portions 43', respectively. A plurality of recesses 45 are formed, and each of the recesses 45 is formed between two corresponding ones of the first spacers 44' to expose portions of the upper surface of the semiconductor stack 30.

Portions of the semiconductor stack 30 and portions of the semiconductor substrate 20 in positions below those of the recesses 45, respectively, are removed using a suitable etching process (for example, a wet etching process, a dry etching, or a combination thereof), such that the recesses 45 further extend downwardly in the second direction (Y) through the semiconductor stack 30 and an upper portion 21 of the semiconductor substrate 20 to terminate at a lower portion 22 of the semiconductor substrate 20, so as to form the semiconductor stack portions 30' spaced apart from each other by the recesses 45 in the first direction (X). The channel layer portion 32' of each of the semiconductor stack portions 30' thus formed has two opposite straight lateral surfaces 321 extending in the second direction (Y). Each of the straight lateral surfaces 321 of the channel layer portion 32' faces a corresponding one of the recesses 45. The etching process for forming the semiconductor stack portions 30' is designed to permit each of the straight lateral surfaces 321 of the channel layer portion 32' to be aligned with (or oriented in) a crystal plane of the channel layer portion 32' that has a lowest etching rate for an etchant used to laterally recess the channel layer portion 32' (which will be described hereinafter) among those of the crystal planes of the channel layer portion 32' which are able to expose to the recesses 45. In some embodiments, in which the channel layer portion 32' is formed from the channel layer 32 that is formed on the silicon (100) wafer, which serves as the semiconductor substrate 20, by the epitaxial growth process, the crystal planes of the channel layer portion 32' which are able to expose to the recesses 45 (i.e., which are candidates of exposing to the recesses 45) include the (100) and (110) crystal planes which the silicon (100) wafer has. The etching process for forming the semiconductor stack portions 30' is designed to permit each of the straight lateral surfaces 321 of the channel layer portion 32' to be aligned with the (100) crystal plane which has the lowest etching rate for the etchant used to laterally recess the channel layer portion 32' among the (100), (110) crystal planes of the channel layer portion 32'. In some embodiments, in which the channel layer portion 32' is formed from the channel layer 32 that is formed on the silicon (110) wafer, which serves as the semiconductor substrate 20, by the epitaxial growth process, the crystal planes of the channel layer portion 32' which are able to expose to the recesses 45 (i.e., which are candidates of exposing to the recesses 45) include the (100), (110), and (111) crystal planes that the silicon (110) wafer has. The etching process for forming the semiconductor stack portions 30' is designed to permit each of the straight lateral surfaces 321 of the channel layer portion 32' to be aligned with the (111) crystal plane which has the lowest etching rate for the etchant used to laterally recess the channel layer portion 32' among the (100), (110), (111) crystal planes of the channel layer portion 32'. The channel layer portion 32' of each of the semiconductor stack portions 30' has a first dimension (D1) in the first direction (X). The first dimension (D1) is the same along the second direction (Y).

Figure 20:
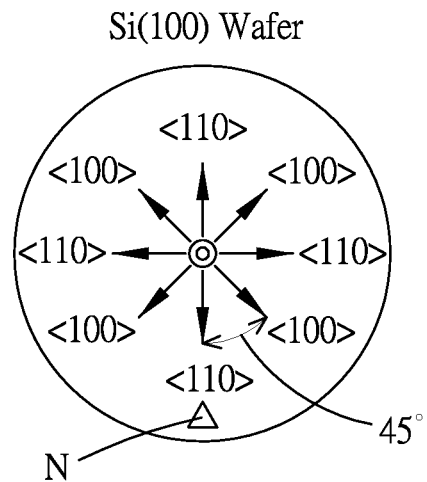
Figure 21:
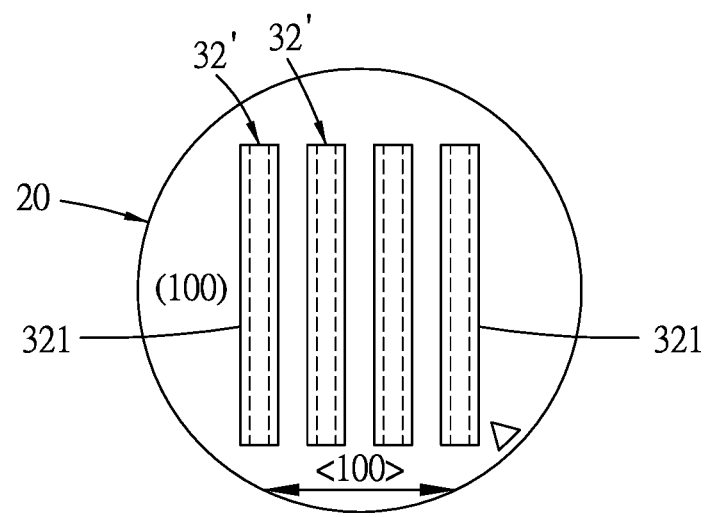

As described above, the channel layer 32 and the channel layer portion 32' formed therefrom have the crystal planes which are the same as those of the semiconductor substrate 20. Therefore, formation of the channel layer portion 32' having the straight lateral surfaces 321, each of which is aligned with the crystal plane having the lowest etching rate for the etchant used to laterally recess the channel layer portion 32' among those of the crystal planes of the channel layer portion 32' which are able to expose the recesses 45, can be achieved by optionally rotating the wafer serving as the semiconductor substrate 20 at a predetermined angle, followed by the etching process for forming the semiconductor stack portions 30'. Referring to FIGS. 6, 20, and 21, in some embodiments in which the silicon (100) wafer serves as the semiconductor substrate 20, when a notch (N) formed in the silicon (100) wafer indicates a crystal orientation (for example, a <110> crystal orientation) of which a projection on a plane of the silicon (100) wafer is deviated from a projection of a predetermined crystal orientation (for example, a <100> crystal orientation) on the plane of the silicon (100) wafer, such that each of the straight lateral surfaces 321 of the channel layer portion 32' formed by directly performing the etching process for forming the semiconductor stack portions 30' will not be aligned with the crystal plane (for example, the (100) crystal plane) that has the lowest etching rate for the etchant used to laterally recess the channel layer portion 32' among the crystal planes (the (100) and (110) crystal planes) of the channel layer portion 32' which are able to expose to the recesses 45, the silicon (100) wafer should be rotated at a predetermined angle (for example, about 45°) defined between the projection of the crystal orientation which the notch (N) indicates and the projection of the predetermined crystal orientation on the plane of the silicon (100) wafer, before the etching process for forming the semiconductor stack portions 30' is performed, so as to permit each of the straight lateral surfaces 321 of the channel layer portion 32' formed after the etching process to be aligned with the crystal plane (for example, the (100) crystal plane) that has the lowest etching rate for the etchant used to laterally recess the channel layer portion 32' among the crystal planes (the (100) and (110) crystal planes) of the channel layer portion 32' which are able to expose to the recesses 45. As shown in FIG. 21, each of the straight lateral surfaces 321 of the channel layer portion 32' is aligned with the (100) crystal plane (i.e., a crystal plane to which a <100> crystal orientation is perpendicular).

Figure 22:
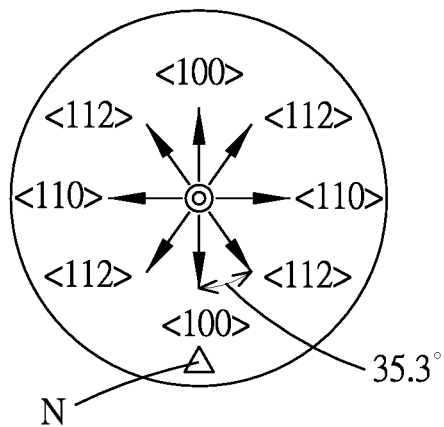
Figure 23:
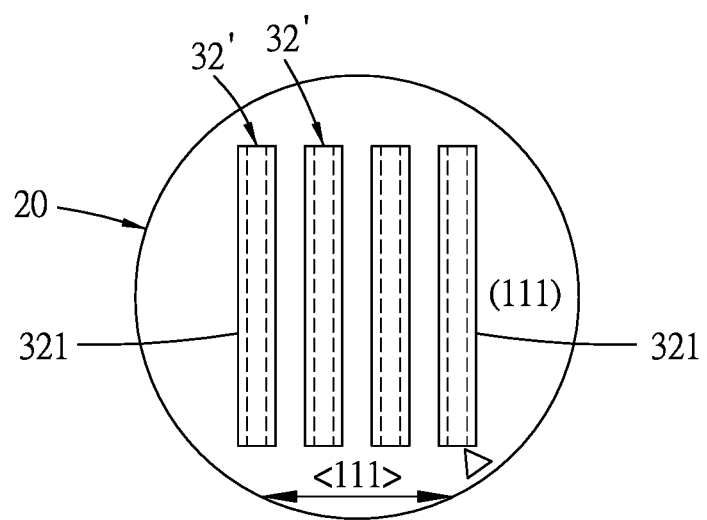

Referring to FIGS. 6, 22, and 23, in some embodiments in which the silicon (110) wafer serves as the semiconductor substrate 20, when a notch (N) formed in the silicon (110) wafer indicates a crystal orientation (for example, a <100> crystal orientation) of which a projection on a plane of the silicon (110) wafer is deviated from a projection of a predetermined crystal orientation (for example, a <112> crystal orientation) on the plane of the silicon (110) wafer, such that each of the straight lateral surfaces 321 of the channel layer portion 32' formed by directly performing the etching process for forming the semiconductor stack portions 30' will not be aligned with the crystal plane (for example, the (111) crystal plane) that has the lowest etching rate for the etchant used to laterally recess the channel layer portion 32' among the crystal planes (the (100), (110), and (111) crystal planes) of the channel layer portion 32' which are able to expose to the recesses 45, the silicon (110) wafer should be rotated at a predetermined angle (for example, about 35.3°) defined between the projection of the crystal orientation which the notch (N) indicates and the projection of the predetermined crystal orientation on the plane of the silicon (110) wafer, before the etching process for forming the semiconductor stack portions 30' is performed, so as to permit each of the straight lateral surfaces 321 of the channel layer portion 32' formed after the etching process to be aligned with the crystal plane (for example, the (111) crystal plane) that has the lowest etching rate for the etchant used to laterally recess the channel layer portion 32' among the crystal planes (the (100), (110), and (111) crystal planes) of the channel layer portion 32' which are able to expose to the recesses 45. As shown in FIG. 23, each of the straight lateral surfaces 321 of the channel layer portion 32' is aligned with the (111) crystal plane (i.e., a crystal plane to which a <111> crystal orientation is perpendicular).

Figure 7:
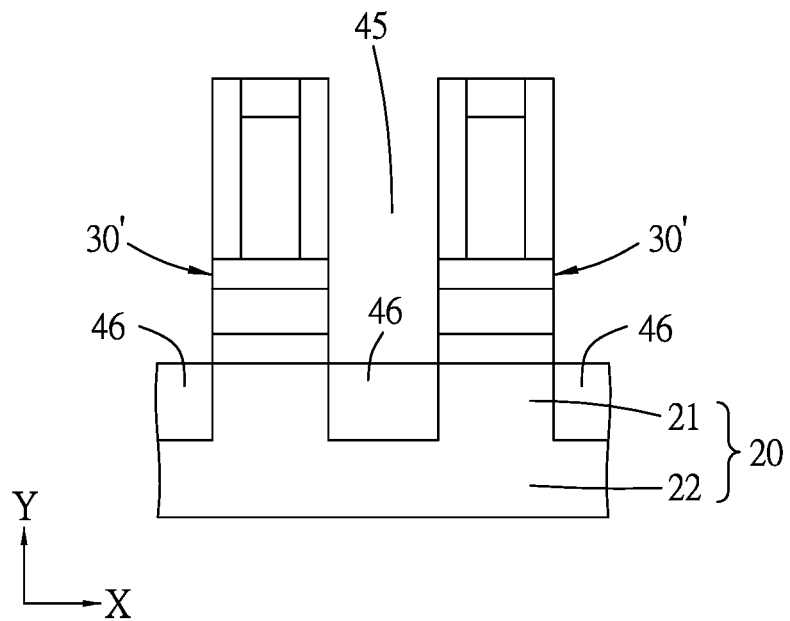

Referring to FIG. 1A and the example illustrated in FIG. 7, the method 10 proceeds to step S06, where a plurality of isolation portions 46 are formed in lower recess portions of the recesses 45, respectively. The isolation portions 46 thus formed are disposed in the upper portion 21 of the semiconductor substrate 20, and two adjacent ones of the isolation portions 46 are located at two opposite sides of a corresponding one of the semiconductor stack portions 30'. In some embodiments, the isolation portions 46 may be made of an oxide-based material (e.g., silicon oxide), a nitride-based material (e.g., silicon nitride), or a combination thereof. Other suitable materials for the isolation portions 46 are within the contemplated scope of the present disclosure. In some embodiments, the isolation portions 46 may be formed by a suitable deposition process, for example, but not limited to, CVD, physical vapor deposition (PVD), or other suitable deposition processes, followed by a selective etching back process, if necessary. In some embodiments, the isolation portions 46 may serve as shallow trench isolations (STIs) or other suitable isolation structures.

Figure 8:
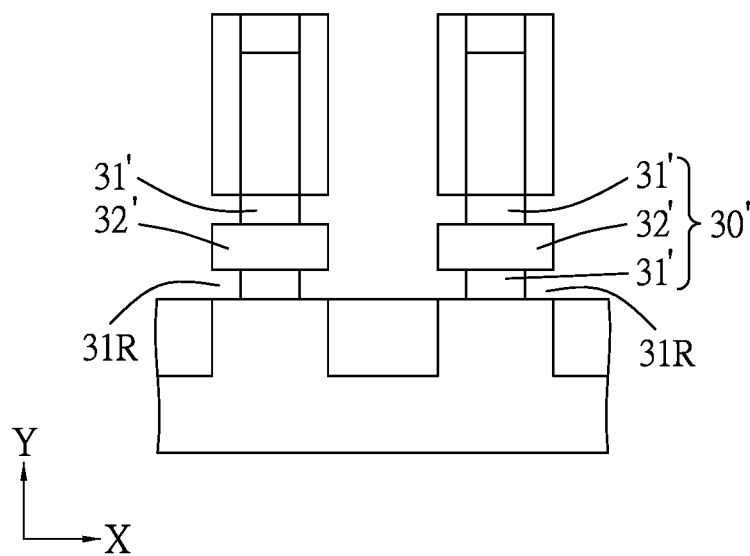

Referring to FIG. 1A and the example illustrated in FIG. 8, the method 10 proceeds to step S07, where the sacrificial layer portions 31' of the semiconductor stack portions 30' are laterally recessed by an isotropic etching process, for example, but not limited to, a wet etching process or other suitable etching processes to remove side portions of the sacrificial layer portions 31' based on a relatively high etching selectivity of the sacrificial layer portions 31' with respect to the channel layer portions 32', so as to form a plurality of lateral recesses 31R.

Figure 9:
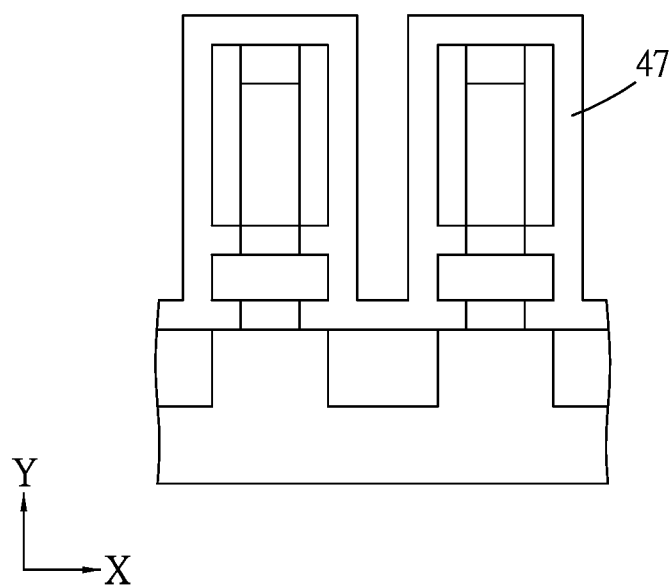

Referring to FIG. 1A and the example illustrated in FIG. 9, the method 10 proceeds to step S08, where an inner spacer material layer 47 is formed. The inner spacer material layer 47 is conformally deposited over the structure shown in FIG. 8 so as to fill the lateral recesses 31R formed in the structure shown in FIG. 8. The inner spacer material layer 47 may be formed by a suitable deposition process, for example, but not limited to, CVD, PECVD, PVD, ALD, PEALD, or other suitable deposition processes. The inner spacer material layer 47 may include, for example, but not limited to, silicon oxide, silicon nitride, silicon oxycarbide, silicon oxynitride, silicon carbon nitride, silicon oxycarbonitride, low k materials, or combinations thereof. Other suitable materials for the inner spacer material layer 47 are within the contemplated scope of the present disclosure.

Figure 10:
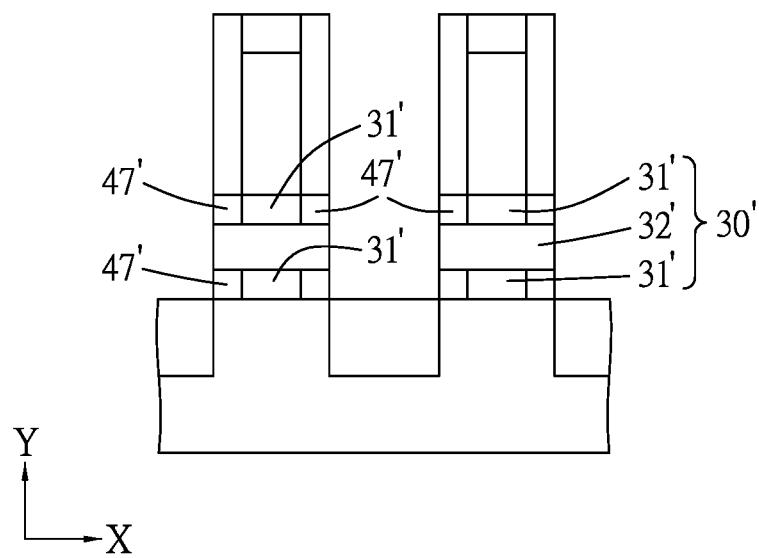

Referring to FIG. 1A and the example illustrated in FIG. 10, the method 10 proceeds to step S09, where a plurality of inner spacers 47' are formed in the lateral recesses 31R formed in the structure shown in FIG. 8. In some embodiments, the inner spacers 47' may be formed by isotropically etching the inner spacer material layer 47 of the structure shown in FIG. 9 to form the inner spacers 47' in the lateral recesses 31R so as to laterally cover the sacrificial layer portions 31'.

Figure 11:
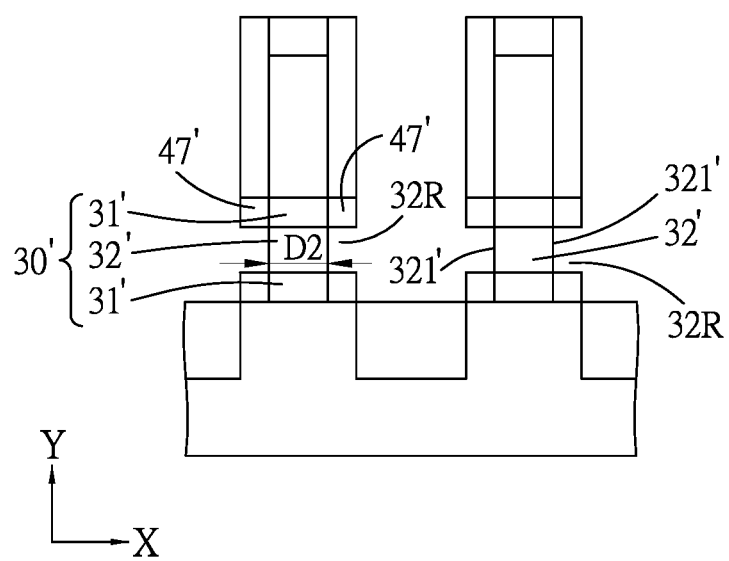

Referring to FIG. 1B and the example illustrated in FIG. 11, the method 10 proceeds to step S10, where the channel layer portions 32' of the semiconductor stack portions 30' are laterally recessed by an isotropic etching process, for example, but not limited to, a wet etching process or other suitable etching processes, to remove side portions of the channel layer portions 32' based on a relatively high etching selectivity of the channel layer portions 32' with respect to the inner spacers 47', so as to form a plurality of lateral recesses 32R. Each of the channel layer portions 32', after being laterally recessed by the isotropic etching process, is formed with two opposite straight lateral surfaces 321', each of which faces a corresponding one of the lateral recesses 32R. In some embodiments, the wet etching process is performed using an alkaline etchant. In some embodiments, the alkaline etchant includes, for example, but not limited to, ammonium hydroxide ($NH_4OH$), tetramethylammonium hydroxide (TMAH), sodium hydroxide (NaOH), potassium hydroxide (KOH), ethylenediamine tetraacetic acid (EDTA), or the like, or combinations thereof. Each of the channel layer portions 32', after being laterally recessed by the isotropic etching process, has a second dimension (D2) in the first direction. The second dimension (D2) is the same along the second direction (Y) and is smaller than the first dimension (D1) of each of the channel layer portions 32' before being laterally recessed.

Referring to the examples illustrated in FIGS. 6 and 24 to 26, if each of the straight lateral surfaces 321 of the channel layer portions 32' formed by the etching process performed in step S05 (see FIG. 6) is not aligned with the crystal plane (for example, the (100) crystal plane for the channel layer portions 32' formed on the silicon (100) wafer or the (111) crystal plane for the channel layer portions 32' formed on the silicon (110) wafer) that has the lowest etching rate for the etchant used to laterally recess the channel layer portions 32' among those of the crystal planes of the channel layer portions 32' which are able to expose to the recesses 45, the channel layer portions 32', after being laterally recessed by directly performing the isotropic etching process without rotating the silicon (100) or (11) wafer (i.e., the semiconductor substrate 20) at the predetermined angle described above, will be formed with lateral surfaces 321", which are not configured as straight lateral surfaces. Therefore, a necking part 322 is formed in each of the channel layer portions 32' due to a faceting issue, and the channel layer portions 32' may collapse in the subsequent processing stages.

Figure 24:
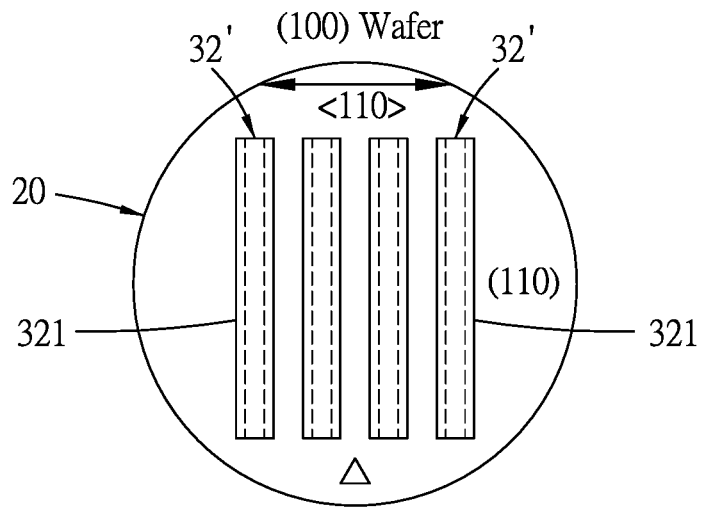
FIGS. 24 to 26 illustrate schematic views of some intermediate stages of a method for manufacturing a semiconductor structure.
Figure 25:
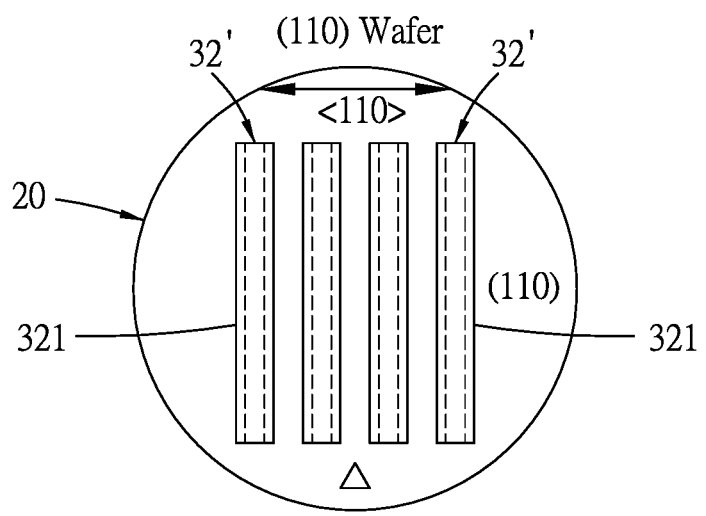
Figure 26:
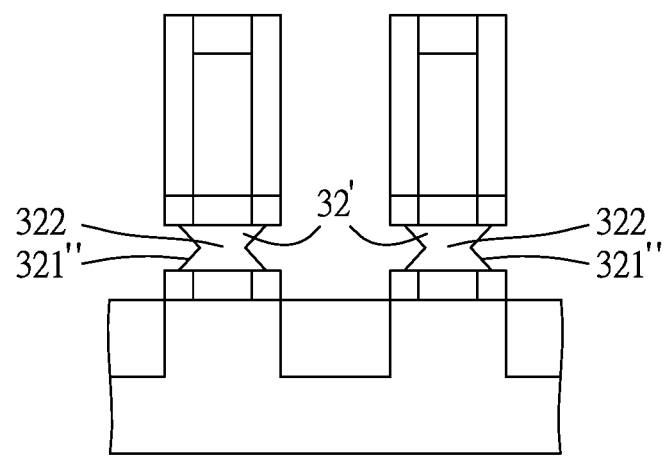

FIG. 24 is a view showing each of the straight lateral surfaces 321 of the channel layer portions 32' formed on the silicon (100) wafer serving as the semiconductor substrate 20 is aligned with the (110) crystal plane (i.e., a crystal plane to which a <110> crystal orientation is perpendicular), which is not the crystal plane having the lowest etching rate for the etchant used to laterally recess the channel layer portions 32' among those of the crystal planes of the channel layer portions 32' which are able to expose to the recesses 45. FIG. 25 is another view showing each of the straight lateral surfaces 321 of the channel layer portions 32' formed on the silicon (110) wafer serving as the semiconductor substrate 20 is aligned with the (110) crystal plane (i.e., a crystal plane to which the <110> crystal orientation is perpendicular), which is not the crystal plane having the lowest etching rate for the etchant used to laterally recess the channel layer portions 32' among those of the crystal planes of the channel layer portions 32' which are able to expose to the recesses 45. The channel layer portions 32', after being laterally recessed, will be formed with the lateral surfaces 321", which are not configured as straight lateral surfaces due to the faceting issue. The faceting issue arises from the crystal plane of the channel layer portions 32' (for example, the (100) crystal plane for the channel layer portions 32' formed on the silicon (100) wafer or the (111) crystal plane for the channel layer portions 32' formed on the silicon (110) wafer) that has the lowest etching rate among the crystal planes of the channel layer portions 32' becoming a "stop"

plane when the channel layer portions 32' shown in FIGS. 24 and 25 are laterally etched using the etchant (for example, the alkaline etchant).

Figure 12:
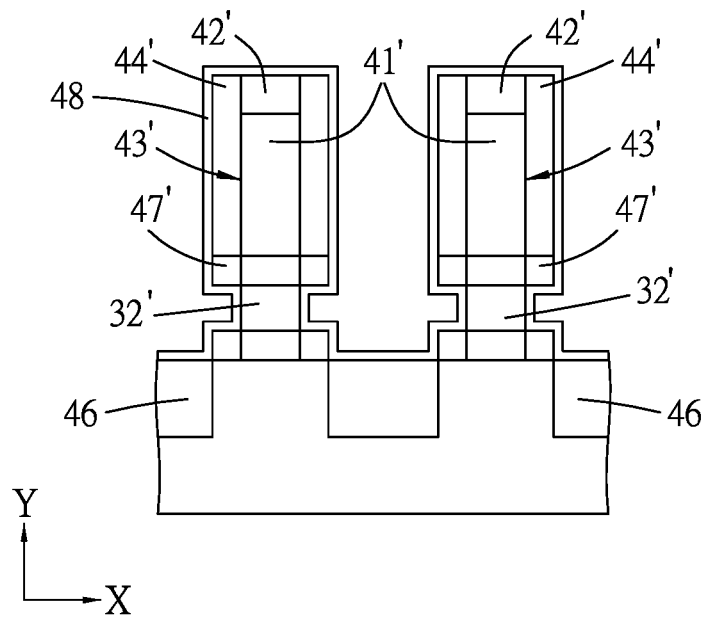

Referring to FIG. 1B and the example illustrated in FIG. 12, the method 10 proceeds to step S11, where a gate dielectric material layer 48 is formed. In some embodiments, the gate dielectric material layer 48 may be formed by conformally depositing a dielectric material over the structure shown in FIG. 11 using, for example, CVD, ALD, or other suitable deposition techniques, to cover the mask portions 43', the first spacers 44', the inner spacers 47', the channel layer portions 32', and the isolation portions 46. In some embodiments, the dielectric material for forming the gate dielectric material layer 48 may include a high k dielectric material, for example, but not limited to, hafnium oxide, silicon nitride, silicon oxynitride, titanium oxide, hafnium zirconium oxide, tantalum oxide, hafnium silicon oxide, zirconium oxide, zirconium silicon oxide, lanthanum oxide, aluminum oxide, yttrium oxide, strontium titanate, barium titanate, barium zirconate, lanthanum silicon oxide, aluminum silicon oxide, hafnium lanthanum oxide, hafnium silicon oxide, aluminum silicon oxide, hafnium tantalum oxide, hafnium titanium oxide, or combinations thereof. Other suitable materials for the gate dielectric material layer 48 are within the contemplated scope of the present disclosure.

Figure 13:
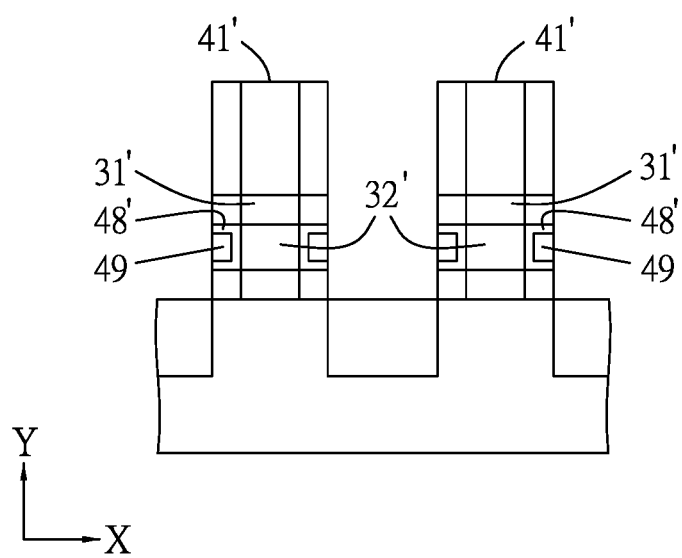

Referring to FIG. 1B and the example illustrated in FIG. 13, the method 10 proceeds to step S12, where a plurality of gate dielectric layers 48' and a plurality of gate electrodes 49 are formed. In some embodiments, each of the gate electrodes 49 may be configured as a multi-layered structure including at least one work function layer which is provided for adjusting threshold voltage of the device units 101 (see FIG. 19) and an electrically conductive layer having a low resistance which is provided for increasing electrical conductivity of the gate electrodes 49. In some embodiments, the work function layer may include metal (for example, but not limited to, tungsten (W) or the like), metal nitride (for example, but not limited to, titanium nitride (TiN), tungsten nitride (WN), or the like), or a combination thereof. Other suitable materials for the work function layer are within the contemplated scope of the present disclosure. In some embodiments, the electrically conductive layer may include a metal material (e.g., tungsten (W), titanium (Ti), tantalum (Ta), aluminum (Al), ruthenium (Ru), or the like), metal-containing nitrides (e.g., titanium nitride (TiN), tantalum nitride (TaN), or the like), metal-containing silicides (e.g., nickel silicide (NiSi) or the like), metal-containing carbides (e.g., tantalum carbide (TaC) or the like), or combinations thereof. Other suitable materials for the electrically conductive layer are within the contemplated scope of the present disclosure. In some embodiments, a work function material layer for forming the work function layer and an electrically conductive material layer for forming the electrically conductive layer are conformally deposited on the gate dielectric material layer 48 of the structure shown in FIG. 12. Excess portions of the work function material layer, the electrically conductive material layer, and the gate dielectric material layer 48 are removed by one or more etching processes, for example, but not limited to, a wet etching process, a dry etching process, other suitable etching techniques, or combinations thereof, such that the remainders of the work function material layer and the electrically conductive material layer together serve as the gate electrodes 49, and remainder of the gate dielectric material layer 48 serves as the gate dielectric layers 48'. Each of the gate dielectric layers 48' is disposed to permit a corresponding one of the gate electrodes 49 to be isolated from a corresponding one of the channel layer portions 32'. In some embodiments, the work function material layer and the electrically conductive material layer may be conformally deposited after the gate dielectric layers 48' are formed. In some embodiments, the second patterned mask layer 42' of the structure shown in FIG. 12 is removed by a planarization process, for example, but not limited to, a chemical mechanical polishing (CMP) process or other suitable planarization processes. A top portion of the first patterned mask layer 41' may also be removed by the planarization process.

Figure 14:
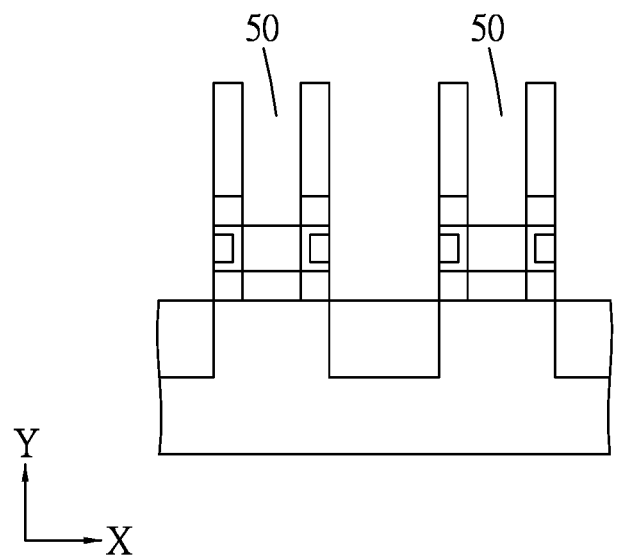

Referring to FIG. 1B and the example illustrated in FIG. 14, the method 10 proceeds to step S13, where a plurality of first source/drain recesses 50 are formed. The first patterned mask layer 41' and the sacrificial layer portions 31' disposed on the channel layer portions 32' (see FIG. 13) are removed by one or more selective etching processes, for example, but not limited to, a wet etching process, a dry etching process, other suitable selective etching techniques, or combinations thereof, to form the first source/drain recesses 50.

Figure 15:
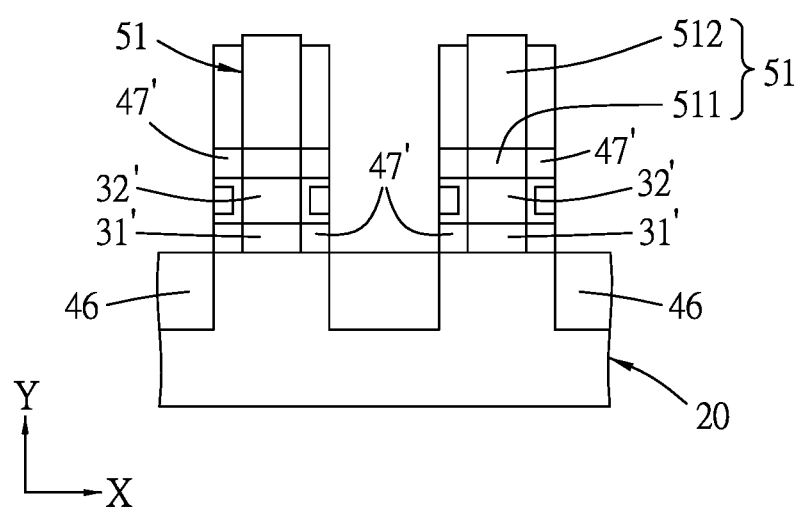

Referring to FIG. 1B and the example illustrated in FIG. 15, the method 10 proceeds to step S14, where a plurality of first source/drain regions 51 are formed. In some embodiments, each of the first source/drain regions 51 may include a first layer 511 disposed on a corresponding one of the channel layer portions 32', and a first source/drain feature 512. In some embodiments, the first layer 511 may be made of a material the same as or different from that of the channel layer portions 32'. In some embodiments, the first layer 511 may be made of an undoped semiconductor material (for example, but not limited to, single crystalline Si). In some embodiments, the first layer 511 may be formed in a lower portion of each of the first source/drain recesses 50 (see FIG. 14) by, for example, but not limited to, an epitaxial growth process including CVD, molecular-beam epitaxy (MBE), an epitaxial deposition/partial etch process, such as a cyclic deposition-etch (CDE) process, and/or a selective epitaxial growth (SEG) process. Other suitable processes for forming the first layer 511 are within the contemplated scope of the present disclosure. In some embodiments, the first source/drain features 512 may include single crystalline or polycrystalline silicon, single crystalline or polycrystalline silicon germanium, or other suitable materials. The first source/drain features 512 may be doped with an n-type impurity to have an n-type conductivity or doped with a p-type impurity to have a p-type conductivity. In some embodiments, the first source/drain features 512 may be formed as a single layer structure or a multi-layered structure having several sub-layers with different doping concentration. In some embodiments, the p-type impurity may be, for example, but not limited to, boron (B), aluminum (Al), gallium (Ga), indium (In), other suitable materials, or combinations thereof. In some embodiments, the n-type impurity may be, for example, but not limited to, nitrogen (N), phosphorous (P), arsenic (As), antimony (Sb), other suitable materials, or combinations thereof. In some embodiments, formation of the first source/drain features 512 may be performed using an epitaxial growth process including CVD, MBE, an epitaxial deposition/partial etch process, such as a cyclic deposition-etch (CDE) process and/or a selective epitaxial growth (SEG) process, but is not limited thereto. In some embodiments, the n-type impurity and the p-type impurity may be in-situ doped along with the formation of the first source/drain features 512. In some other embodiments, the n-type impurity and the p-type impurity may be post doped after the formation of the first source/drain features 512.

Figure 16:
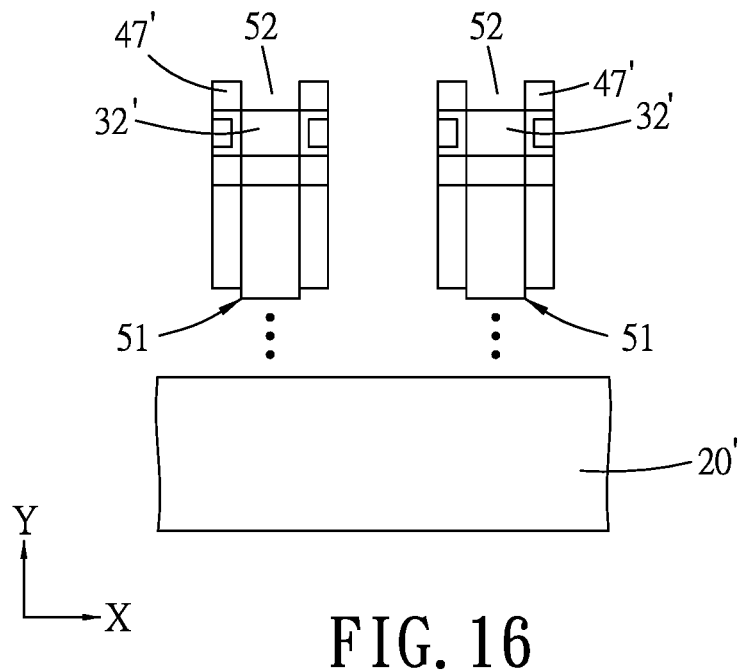

Referring to FIG. 1B and the example illustrated in FIG. 16, the method 10 proceeds to step S15, where a semiconductor structure is flipped over. The structure shown in FIG. 15 may be further processed by one or more steps to form a semiconductor structure. Thereafter, the semiconductor structure is flipped over by bonding an upper surface of the semiconductor structure to a first carrier substrate 20', flipping over the semiconductor structure, and removing the semiconductor substrate 20 and the isolation portions 46 shown in FIG. 15 by the planarization process, e.g., the CMP process. The sacrificial layer portions 31' disposed on the channel layer portions 32' opposite to the first source/drain regions 51, respectively, are removed by a selective etching process, for example, but not limited to, a wet etching process, a dry etching process, other suitable etching techniques based on a relatively high etching selectivity of the sacrificial layer portions 31' with respect to the inner spacers 47', so as to form a plurality of second source/drain recesses 52 to expose the channel layer portions 32'. Since the possible materials for the carrier substrate 20' may be the same as or similar to those of the semiconductor substrate 20, details thereof are omitted for the sake of brevity.

Figure 17:
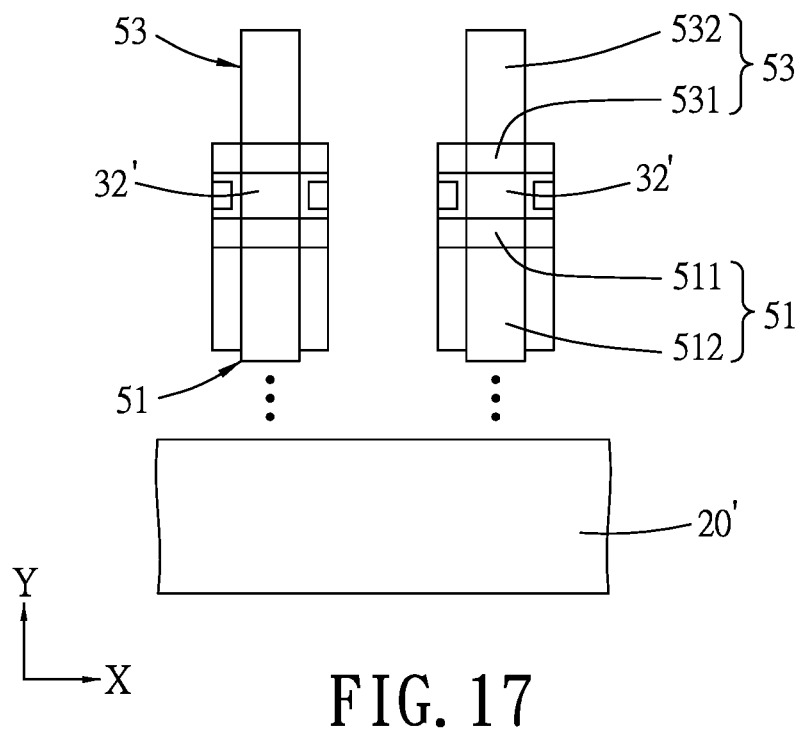

Referring to FIG. 1B and the example illustrated in FIG. 17, the method 10 proceeds to step S16, where a plurality of second source/drain regions 53 are formed. In some embodiments, each of the second source/drain regions 53 may include a first layer 531 disposed on a corresponding one of the channel layer portions 32' opposite to a corresponding one of the first source/drain regions 51, and a second source/drain feature 532 disposed on the first layer 531 opposite to a corresponding one of the channel layer portions 32'. The second source/drain feature 532 has a conductivity type different from that of the first source/drain feature 512. In some embodiments, the first source/drain feature 512 has the p-type conductivity and the second source/drain feature 532 has the n-type conductivity, or vice versa. Since the processes and possible materials for the first layers 531 of the second source/drain regions 53 may be the same as or similar to the processes and the possible materials for the first layers 511 of the first source/drain regions 51 described with reference to FIG. 15, details thereof are omitted for the sake of brevity. Similarly, since the processes and possible materials for the second source/drain features 532 of the second source/drain regions 53 may be the same as or similar to the processes and the possible materials for the first source/drain features 512 of the first source/drain regions 51 described with reference to FIG. 15, details thereof are omitted for the sake of brevity.

Referring to FIG. 1B and the example illustrated in FIG. 18, the method 10 proceeds to step S17, where a plurality of second spacers 54 are formed. The second spacers 54 are disposed on the inner spacers 47', respectively, such that two of the second spacers 54 cover two opposite lateral surfaces of a corresponding one of the second source/drain features 532, respectively. Since the processes and possible materials for the second spacers 54 may be the same as or similar to the processes and the possible materials for the first spacers 44' described with reference to FIGS. 5 and 6, details thereof are omitted for the sake of brevity.

Referring to FIG. 1B and the example illustrated in FIG. 19, the method 10 proceeds to step S18, where a semiconductor structure is flipped over. The structure shown in FIG. 18 may be further processed by one or more steps to form a semiconductor structure. Thereafter, the semiconductor structure is flipped over by bonding an upper surface of the semiconductor structure to a second carrier substrate 20", flipping over the semiconductor structure, and removing the first carrier substrate 20' shown in FIG. 18 by the planarization process, e.g., the CMP process, such that a plurality of the device units 101 are formed on the second carrier substrate 20". The possible materials for the second carrier substrate 20" may be the same as or similar to those for the semiconductor substrate 20, and thus, details thereof are omitted for the sake of brevity. Each of the device units 101 includes a corresponding one of the second source/drain regions 53 disposed on the second carrier substrate 20", two corresponding ones of the second spacers 54 covering two opposite lateral surfaces of the second source/drain feature 532 of the corresponding one of the second source/drain regions 53, two corresponding ones of the inner spacers 47' covering two opposite lateral surfaces of the first layer 531 of the corresponding one of the second source/drain regions 53, a corresponding one of the channel layer portions 32' disposed on the corresponding one of the second source/drain regions 53 and formed with the straight lateral surfaces 321', two corresponding ones of the gate dielectric layers 48' respectively covering the straight lateral surfaces 321' of the corresponding one of the channel layer portions 32', two corresponding ones of the gate electrodes 49 isolated from the corresponding one of the channel layer portion 32' by the two corresponding ones of the gate dielectric layers 48', respectively, a corresponding one of the first source/drain regions 51 disposed on the corresponding one of the channel layer portion 32', two corresponding ones of the inner spacers 47' covering two opposite lateral surfaces of the first layer 511 of the corresponding one of the first source/drain regions 51, and two corresponding ones of the first spacers 44' covering two opposite lateral surfaces of the first source/drain feature 512 of the corresponding one of the first source/drain regions 51.

In a method for manufacturing a semiconductor structure of the present disclosure, an etching process for forming semiconductor stack portions spaced apart from each other by a plurality of recesses is designed to permit each of straight lateral surfaces of channel layer portions of the semiconductor stack portions thus formed to be aligned with a crystal plane having a lowest etching rate for an etchant (for example, but not limited to, an alkaline etchant) used to laterally recess the channel layer portions among those of the crystal planes of the channel layer portions which are able to expose to the recesses. Therefore, each of the channel layer portions, after being laterally recessed by an isotropic etching process using the etchant, is formed with two opposite straight lateral surfaces, such that the channel layer portions will not collapse in subsequent processing stages of the method of the present disclosure.

In accordance with some embodiments of the present disclosure, a method for manufacturing a semiconductor structure includes: forming a plurality of semiconductor stack portions on a semiconductor substrate, in which the semiconductor stack portions are spaced apart from each other by a plurality of first recesses in a first direction parallel to a surface of the semiconductor substrate, each of the semiconductor stack portions includes two sacrificial layer portions and a channel layer portion disposed between the sacrificial layer portions in a second direction transverse to the first direction, and the channel layer portion has a plurality of crystal planes and is formed with a first straight lateral surface which extends in the second direction and which is aligned with one of the crystal planes that has a lowest etching rate for an etchant to be used for laterally etching the channel layer portion among those of the crystal planes of the channel layer portion which are able to expose to the first recesses; forming two inner spacers, each of which laterally covers a corresponding one of the sacrificial layer portions such that the inner spacers are separated from each other by the channel layer portion; and laterally etching the channel layer portion using the etchant to form a second recess between the two inner spacers and to permit the channel layer portion to be formed with a second straight lateral surface facing the lateral recess and extending in the second direction.

In accordance with some embodiments of the present disclosure, formation of the semiconductor stack portions includes: forming a semiconductor stack on the semiconductor substrate, in which the semiconductor stack includes two sacrificial layers and a channel layer disposed between the sacrificial layers in the second direction; rotating the semiconductor substrate at a predetermined angle; and patterning the semiconductor stack by an etching process.

In accordance with some embodiments of the present disclosure, the semiconductor substrate is a wafer which is made of a crystalline semiconductor material and which is formed with a notch to indicate a crystal orientation of the wafer, and the predetermined angle is defined between projection of the crystal orientation which the notch indicates and projection of a predetermined crystal orientation of the wafer on the plane of the wafer.

In accordance with some embodiments of the present disclosure, the wafer is a silicon (100) wafer, the crystal orientation which the notch indicates is a <110> crystal orientation, and the predetermined crystal orientation is a <100> crystal orientation.

In accordance with some embodiments of the present disclosure, the channel layer portion has crystal planes which are the same as those of the silicon (100) wafer, and the first straight lateral surface of the channel layer portion is aligned with a (100) crystal plane.

In accordance with some embodiments of the present disclosure, the wafer is a silicon (110) wafer, the crystal orientation which the notch indicates is a <100> crystal orientation, and the predetermined crystal orientation is a <112> crystal orientation.

In accordance with some embodiments of the present disclosure, the channel layer portion has crystal planes which are the same as those of the silicon (110) wafer, and the first straight lateral surface of the channel layer portion is aligned with a (111) crystal plane.

In accordance with some embodiments of the present disclosure, a method for manufacturing a semiconductor structure includes: forming a plurality of semiconductor stack portions on a semiconductor substrate, in which the semiconductor stack portions are spaced apart from each other by a plurality of first recesses in a first direction parallel to a surface of the semiconductor substrate, each of the semiconductor stack portions includes two sacrificial layer portions and a channel layer portion disposed between the sacrificial layer portions in a second direction transverse to the first direction, the channel layer portion has a plurality of crystal planes and is formed with a straight lateral surface which extends in the second direction and which is aligned with one of the crystal planes that has a lowest etching rate for an etchant to be used for laterally etching the channel layer portion among those of the crystal planes of the channel layer portion which are able to expose to the first recesses, and the channel layer portion has a first dimension in the first direction that is the same along the second direction; forming two inner spacers, each of which laterally covers a corresponding one of the sacrificial layer portions such that the inner spacers are separated from each other by the channel layer portion; and laterally etching the channel layer portion using the etchant to form a second recess between the two inner spacers such that the channel layer portion has a second dimension in the first direction, in which the second dimension is smaller than the first dimension and is the same along the second direction.

In accordance with some embodiments of the present disclosure, formation of the semiconductor stack portions includes: forming a semiconductor stack on the semiconductor substrate, in which the semiconductor stack includes two sacrificial layers and a channel layer disposed between the sacrificial layers in the second direction; rotating the semiconductor substrate at a predetermined angle; and patterning the semiconductor stack by an etching process.

In accordance with some embodiments of the present disclosure, the semiconductor substrate is a wafer which is made of a crystalline semiconductor material and which is formed with a notch to indicate a crystal orientation of the wafer, and the predetermined angle is defined between projection of the crystal orientation which the notch indicates and projection of a predetermined crystal orientation of the wafer on the plane of the wafer.

In accordance with some embodiments of the present disclosure, the wafer is a silicon (100) wafer, the crystal orientation which the notch indicates is a <110> crystal orientation, and the predetermined crystal orientation is a <100> crystal orientation.

In accordance with some embodiments of the present disclosure, the channel layer portion has crystal planes which are the same as those of the silicon (100) wafer, and the straight lateral surface of the channel layer portion is aligned with a (100) crystal plane.

In accordance with some embodiments of the present disclosure, the wafer is a silicon (110) wafer, the crystal orientation which the notch indicates is a <100> crystal orientation, and the predetermined crystal orientation is a <112> crystal orientation.

In accordance with some embodiments of the present disclosure, the channel layer portion has crystal planes which are the same as those of the silicon (110) wafer, and the straight lateral surface of the channel layer portion is aligned with a (111) crystal plane.

In accordance with some embodiments of the present disclosure, a method for manufacturing a semiconductor structure includes: forming a semiconductor stack on a semiconductor substrate, in which the semiconductor stack includes two sacrificial layers and a channel layer disposed between the sacrificial layers; forming a patterned mask on the semiconductor stack, in which the patterned mask includes a plurality of mask portions spaced apart from each other in a first direction parallel to a surface of the semiconductor substrate; forming a plurality of spacers, such that each of the mask portions is laterally covered by two corresponding ones of the spacers to form a plurality of first recesses spaced apart from each other in the first direction; patterning the semiconductor stack by an etching process through the first recesses so as to permit the first recesses to extend downwardly to form a plurality of semiconductor stack portions spaced apart from each other by the first recesses in the first direction, in which each of the semiconductor stack portions includes two sacrificial layer portions and a channel layer portion disposed between the sacrificial layer portions in a second direction transverse to the first direction, and the channel layer portion has a plurality of crystal planes and is formed with a first straight lateral surface which extends in the second direction and which is aligned with one of the crystal planes that has a lowest etching rate for an etchant to be used for laterally etching the channel layer portion among those of the crystal planes of the channel layer portion which are able to expose to the first recesses; forming two inner spacers, each of which laterally covers a corresponding one of the sacrificial layer portions such that the inner spacers are separated from each other by the channel layer portion; and laterally etching the channel layer portion using the etchant to form a second recess between the two inner spacers and to permit the channel layer portion to be formed with a second straight lateral surface facing the lateral recess and extending in the second direction.

In accordance with some embodiments of the present disclosure, the method for manufacturing a semiconductor structure further includes, prior to patterning the semiconductor stack, rotating the semiconductor substrate at a predetermined angle.

In accordance with some embodiments of the present disclosure, the semiconductor substrate is a wafer which is made of a crystalline semiconductor material and which is formed with a notch to indicate a crystal orientation of the wafer, and the predetermined angle is defined between projection of the crystal orientation which the notch indicates and projection of a predetermined crystal orientation of the wafer on the plane of the wafer.

In accordance with some embodiments of the present disclosure, the wafer is a silicon (100) wafer, the crystal orientation which the notch indicates is a <110> crystal orientation, and the predetermined crystal orientation is a <100> crystal orientation.

In accordance with some embodiments of the present disclosure, the channel layer portion has crystal planes which are the same as those of the silicon (100) wafer, and the first straight lateral surface of the channel layer portion is aligned with a (100) crystal plane.

In accordance with some embodiments of the present disclosure, the wafer is a silicon (110) wafer, the crystal orientation which the notch indicates is a <100> crystal orientation, the predetermined crystal orientation is a <112> crystal orientation, the channel layer portion has crystal planes which are the same as those of the silicon (110) wafer, and the first straight lateral surface of the channel layer portion is aligned with a (111) crystal plane.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:
   forming a plurality of semiconductor stack portions on a semiconductor substrate, the semiconductor stack portions being spaced apart from each other by a plurality of first recesses in a first direction parallel to a surface of the semiconductor substrate, each of the semiconductor stack portions including two sacrificial layer portions and a channel layer portion disposed between the sacrificial layer portions in a second direction transverse to the first direction, the channel layer portion having a plurality of crystal planes and being formed with a first straight lateral surface which extends in the second direction and which is aligned with one of the crystal planes that has a lowest etching rate for an etchant to be used for laterally etching the channel layer portion among those of the crystal planes of the channel layer portion which are able to expose to the first recesses;
   forming two inner spacers, each of which laterally covers a corresponding one of the sacrificial layer portions such that the inner spacers are separated from each other by the channel layer portion; and
   laterally etching the channel layer portion using the etchant to form a second recess between the two inner spacers and to permit the channel layer portion to be formed with a second straight lateral surface facing the second recess and extending in the second direction.

2. The method as claimed in claim 1, wherein formation of the semiconductor stack portions includes:
   forming a semiconductor stack on the semiconductor substrate, the semiconductor stack including two sacrificial layers and a channel layer disposed between the sacrificial layers in the second direction;
   rotating the semiconductor substrate at a predetermined angle; and
   patterning the semiconductor stack by an etching process.

3. The method as claimed in claim 2, wherein the semiconductor substrate is a wafer which is made of a crystalline semiconductor material and which is formed with a notch to indicate a crystal orientation of the wafer, and the predetermined angle is defined between projection of the crystal orientation which the notch indicates and projection of a predetermined crystal orientation of the wafer on the plane of the wafer.

4. The method as claimed in claim 3, wherein the wafer is a silicon (100) wafer, the crystal orientation which the notch indicates is a <110> crystal orientation, and the predetermined crystal orientation is a <100> crystal orientation.

5. The method as claimed in claim 4, wherein the channel layer portion has crystal planes which are the same as those of the silicon (100) wafer, and the first straight lateral surface of the channel layer portion is aligned with a (100) crystal plane.

6. The method as claimed in claim 3, wherein the wafer is a silicon (110) wafer, the crystal orientation which the notch indicates is a <100> crystal orientation, and the predetermined crystal orientation is a <112> crystal orientation.

7. The method as claimed in claim 6, wherein the channel layer portion has crystal planes which are the same as those of the silicon (110) wafer, and the first straight lateral surface of the channel layer portion is aligned with a (111) crystal plane.

8. A method for manufacturing a semiconductor structure, comprising:
   forming a plurality of semiconductor stack portions on a semiconductor substrate, the semiconductor stack portions being spaced apart from each other by a plurality of first recesses in a first direction parallel to a surface of the semiconductor substrate, each of the semiconductor stack portions including two sacrificial layer portions and a channel layer portion disposed between the sacrificial layer portions in a second direction transverse to the first direction, the channel layer portion having a plurality of crystal planes and being formed with a straight lateral surface which extends in the second direction and which is aligned with one of the crystal planes that has a lowest etching rate for an etchant to be used for laterally etching the channel layer portion among those of the crystal planes of the channel layer portion which are able to expose to the first recesses, the channel layer portion having a first dimension in the first direction that is the same along the second direction;

forming two inner spacers, each of which laterally covers a corresponding one of the sacrificial layer portions such that the inner spacers are separated from each other by the channel layer portion; and laterally etching the channel layer portion using the etchant to form a second recess between the two inner spacers such that the channel layer portion has a second dimension in the first direction, the second dimension being smaller than the first dimension and being the same along the second direction.

9. The method as claimed in claim 8, wherein formation of the semiconductor stack portions includes:

forming a semiconductor stack on the semiconductor substrate, the semiconductor stack including two sacrificial layers and a channel layer disposed between the sacrificial layers in the second direction;

rotating the semiconductor substrate at a predetermined angle; and patterning the semiconductor stack by an etching process.

10. The method as claimed in claim 9, wherein the semiconductor substrate is a wafer which is made of a crystalline semiconductor material and which is formed with a notch to indicate a crystal orientation of the wafer, and the predetermined angle is defined between projection of the crystal orientation which the notch indicates and projection of a predetermined crystal orientation of the wafer on the plane of the wafer.

11. The method as claimed in claim 10, wherein the wafer is a silicon (100) wafer, the crystal orientation which the notch indicates is a <110> crystal orientation, and the predetermined crystal orientation is a <100> crystal orientation.

12. The method as claimed in claim 11, wherein the channel layer portion has crystal planes which are the same as those of the silicon (100) wafer, and the straight lateral surface of the channel layer portion is aligned with a (100) crystal plane.

13. The method as claimed in claim 10, wherein the wafer is a silicon (110) wafer, the crystal orientation which the notch indicates is a <100> crystal orientation, and the predetermined crystal orientation is a <112> crystal orientation.

14. The method as claimed in claim 13, wherein the channel layer portion has crystal planes which are the same as those of the silicon (110) wafer, and the straight lateral surface of the channel layer portion is aligned with a (111) crystal plane.

15. A method for manufacturing a semiconductor structure, comprising:

forming a semiconductor stack on a semiconductor substrate, the semiconductor stack including two sacrificial layers and a channel layer disposed between the sacrificial layers;

forming a patterned mask on the semiconductor stack, the patterned mask including a plurality of mask portions spaced apart from each other in a first direction parallel to a surface of the semiconductor substrate;

forming a plurality of spacers, such that each of the mask portions is laterally covered by two corresponding ones of the spacers to form a plurality of first recesses spaced apart from each other in the first direction;

patterning the semiconductor stack by an etching process through the first recesses so as to permit the first recesses to extend downwardly to form a plurality of semiconductor stack portions spaced apart from each other by the first recesses in the first direction, each of the semiconductor stack portions including two sacrificial layer portions and a channel layer portion disposed between the sacrificial layer portions in a second direction transverse to the first direction, the channel layer portion having a plurality of crystal planes and being formed with a first straight lateral surface which extends in the second direction and which is aligned with one of the crystal planes that has a lowest etching rate for an etchant to be used for laterally etching the channel layer portion among those of the crystal planes of the channel layer portion which are able to expose to the first recesses;

forming two inner spacers, each of which laterally covers a corresponding one of the sacrificial layer portions such that the inner spacers are separated from each other by the channel layer portion; and laterally etching the channel layer portion using the etchant to form a second recess between the two inner spacers and to permit the channel layer portion to be formed with a second straight lateral surface facing the second recess and extending in the second direction.

16. The method as claimed in claim 15, further comprising, prior to patterning the semiconductor stack, rotating the semiconductor substrate at a predetermined angle.

17. The method as claimed in claim 16, wherein the semiconductor substrate is a wafer which is made of a crystalline semiconductor material and which is formed with a notch to indicate a crystal orientation of the wafer, and the predetermined angle is defined between projection of the crystal orientation which the notch indicates and projection of a predetermined crystal orientation of the wafer on the plane of the wafer.

18. The method as claimed in claim 17, wherein the wafer is a silicon (100) wafer, the crystal orientation which the notch indicates is a <110> crystal orientation, and the predetermined crystal orientation is a <100> crystal orientation.

19. The method as claimed in claim 18, wherein the channel layer portion has crystal planes which are the same as those of the silicon (100) wafer, and the first straight lateral surface of the channel layer portion is aligned with a (100) crystal plane.

20. The method as claimed in claim 17, wherein the wafer is a silicon (110) wafer, the crystal orientation which the notch indicates is a <100> crystal orientation, the predetermined crystal orientation is a <112> crystal orientation, the channel layer portion has crystal planes which are the same as those of the silicon (110) wafer, and the first straight lateral surface of the channel layer portion is aligned with a (111) crystal plane.

* * * * *